(12) United States Patent
Wares et al.

(10) Patent No.: US 9,998,064 B2
(45) Date of Patent: Jun. 12, 2018

(54) SUN TRACKING SOLAR POWER SYSTEM HARDWARE AND METHOD OF ASSEMBLY

(71) Applicant: SunPower Corporation, San Jose, CA (US)

(72) Inventors: Brian S. Wares, Berkeley, CA (US); Tyler Grushkowitz, Hayward, CA (US); Nicholas McKibben, Berkeley, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 37 days.

(21) Appl. No.: 14/877,651

(22) Filed: Oct. 7, 2015

(65) Prior Publication Data

US 2016/0028345 A1 Jan. 28, 2016

Related U.S. Application Data

(63) Continuation of application No. 14/143,893, filed on Dec. 30, 2013, now Pat. No. 9,184,324.

(51) Int. Cl.
*H02S 20/10* (2014.01)
*F24J 2/54* (2006.01)
(Continued)

(52) U.S. Cl.
CPC ............... *H02S 20/10* (2014.12); *F24J 2/38* (2013.01); *F24J 2/5232* (2013.01); *F24J 2/5254* (2013.01);
(Continued)

(58) Field of Classification Search
CPC ....... H01L 31/042; H01L 31/0522; F24J 2/38; F24J 2/54; F24J 2/541; F24J 2/523
See application file for complete search history.

(56) References Cited

U.S. PATENT DOCUMENTS 4,119,365 A * 10/1978 Powell .................... F24J 2/145
126/684
4,149,665 A * 4/1979 Frosch ................ H01L 31/1876
136/244
(Continued)

FOREIGN PATENT DOCUMENTS

CN 102870231 A 1/2013
CN 103178139 A 6/2013

OTHER PUBLICATIONS

International Search Report dated Mar. 30, 2015 for PCT Application No. PCT/US2014/070587, filed Dec. 16, 2014.
(Continued)

*Primary Examiner* — Golam Mowla
(74) *Attorney, Agent, or Firm* — Oblon, McClelland, Maier & Neustadt, L.L.P.

(57) ABSTRACT

A solar energy collection system can include improved mounting hardware for reducing hardware costs and labor required for assembly. For example, mounting hardware can include surfaces for supporting part or all of the weight of a solar module as it is brought into contact with mounting hardware and then moved into a final engaged position. In some systems, a torque tube can include saddle mount assemblies that allow a solar module to be partially engaged and a registered with the saddle mount while being pivoted into a final locked engagement. Some systems can include arrangements sufficient to support the full weight of a solar module in a disengaged position, and as it is moved into a final engaged position. Some systems can include a configuration of apertures and interference or snap-fit features for providing tool-less connections, thereby simplifying the assembly process.

20 Claims, 14 Drawing Sheets

(51) Int. Cl.
    *F24J 2/38*     (2014.01)
    *H01L 31/042*     (2014.01)
    *H01L 31/052*     (2014.01)
    *F24J 2/52*     (2006.01)
    *H02S 20/32*     (2014.01)

(52) U.S. Cl.
    CPC ............ *F24J 2/5256* (2013.01); *F24J 2/54* (2013.01); *F24J 2/541* (2013.01); *H01L 31/042* (2013.01); *H01L 31/052* (2013.01); *H02S 20/32* (2014.12); *F24J 2002/5216* (2013.01); *F24J 2002/5468* (2013.01); *Y02E 10/47* (2013.01)

(56) References Cited

U.S. PATENT DOCUMENTS

| | | | | |
|---|---|---|---|---|
| 4,172,442 A * | 10/1979 | Boblitz | | F24J 2/0477 126/400 |
| 4,304,221 A * | 12/1981 | Trihey | | F24J 2/10 126/581 |
| 4,324,225 A * | 4/1982 | Trihey | | F24J 2/10 126/581 |
| 4,365,616 A * | 12/1982 | Vandenberg | | F24J 2/1047 126/581 |
| 5,531,216 A * | 7/1996 | Nicklas | | F24J 2/10 126/571 |
| 8,567,134 B1 | 10/2013 | Grushkowitz et al. | | |
| 2004/0007260 A1 * | 1/2004 | Dinwoodie | | F24J 2/523 136/251 |
| 2007/0034207 A1 * | 2/2007 | Niedermeyer | | F24J 2/055 126/600 |
| 2007/0051401 A1 * | 3/2007 | Aaron | | F24J 2/541 136/243 |
| 2009/0120016 A1 * | 5/2009 | Hon | | F24J 2/5233 52/173.3 |
| 2009/0173335 A1 * | 7/2009 | Wanag | | F03G 6/06 126/570 |
| 2011/0203637 A1 | 8/2011 | Patton et al. | | |
| 2011/0265860 A1 | 11/2011 | Ciasulli et al. | | |
| 2013/0039610 A1 | 2/2013 | Schneider et al. | | |
| 2013/0160816 A1 | 6/2013 | Barton | | |

OTHER PUBLICATIONS

Office Action dated Aug. 2, 2017 in Chinese Patent Application No. 201480056119.9.

Office Action dated Feb. 14, 2018 in Chilean Patent Application No. 2016-001651, 28 pages. (The references cited therein were previously cited.).

* cited by examiner

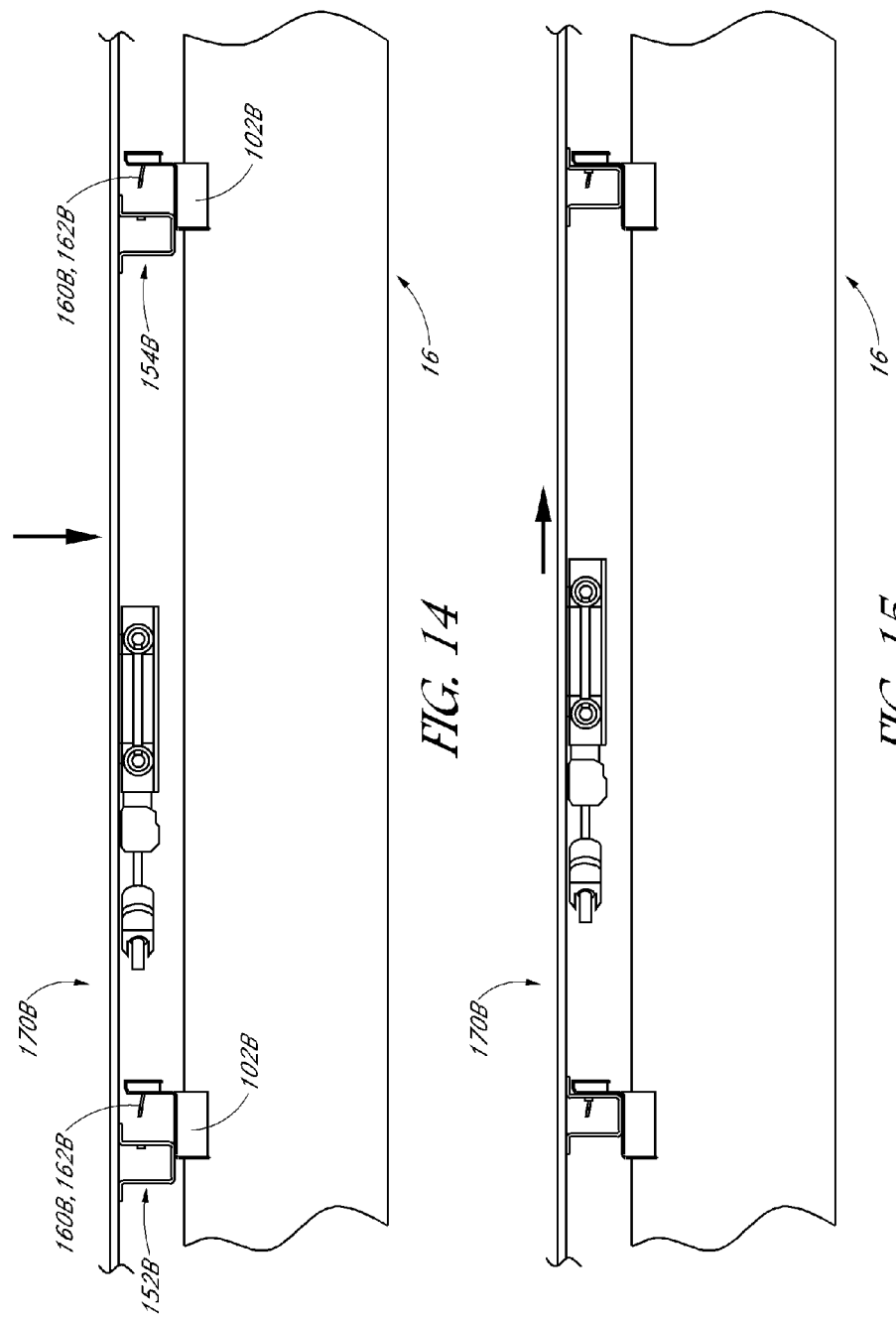

SUN TRACKING SOLAR POWER SYSTEM HARDWARE AND METHOD OF ASSEMBLY

TECHNICAL FIELD

The present disclosure generally relates to components for solar power systems, and more specifically, components for connecting and mounting solar power components such as for sun tracking systems.

BACKGROUND

Some known sun-tracking photovoltaic solar power systems, such as utility-scale, photovoltaic installations, are designed to pivot a large number of solar modules so as to track the movement of the sun using the fewest possible number of drive motors. For example, some known systems include parallel rows of photovoltaic modules supported on torque tubes. The torque tubes can comprise a number of long, round shafts connected together in an end to end fashion, typically fabricated out of metal.

As such, the torque tubes and some of the associated hardware can present a substantial cost of a sun tracking solar power system. Thus, reducing the material, manufacturing costs and/or labor required for assembly of such components can present significant reductions in the cost of financing the initial construction of such a system. Reducing the construction cost of such systems can significantly impact the ability to attain financing for such systems, the servicing of which is sufficiently low to allow such a system to sell electricity, for example, to a regional grid power distribution system, at a rate that is sufficiently high to cover the debt servicing for such initial construction.

BRIEF SUMMARY

An aspect disclosed herein includes the realization that conventional hardware for mounting solar modules to sun tracking systems can be modified to provide simplified and faster procedures for making the appropriate connections, thereby reducing the labor costs associated with such mounting procedures. For example, some embodiments disclosed herein include the realization that hardware can be provided for connecting solar modules to torque tubes with tool-less connections, such as snap fit or other interference type connection mechanisms.

For example, in some embodiments, a solar energy collection system can include first and second solar modules, each comprising a solar collection member including an upper surface configured to receive sunlight for conversion into electrical energy and a lower surface opposite the upper surface, each of the first and second modules also comprising a support frame connected to the lower surface of the solar collection member. A torque member having a longitudinal axis supported above the ground so as to be pivotable through a range of pivot motion can also be included. A plurality of solar module retention members can be fixed to the torque member and comprise a tool-less connection, the tool-less connection having sufficient strength to remain engaged with the support frames of the first and second modules as the torque member is tilted through its sun tracking range of motion.

In some embodiments, a solar energy collection system can comprise first and second solar modules each comprising a solar collection member including an upper surface configured to receive sunlight for conversion into electrical energy and a lower surface opposite the upper surface. The first solar module can also comprise a supporting frame supporting the solar collection module. The first solar module can have a length extending along a longitudinal direction of the solar collection member. The frame can comprise a first side portion connected to the lower surface of the solar collection member on a first side and approximately parallel to the longitudinal axis of the solar collection member and including a first lateral surface extending approximately perpendicular to the upper surface and a first aperture disposed in the first lateral surface. A second side portion of the frame can be connected to the lower surface of the solar collection member and extending along a second side of the longitudinal axis of the solar collection member opposite the first side. A torque member can be supported above the ground surface so as to pivot about a first pivot axis which extends generally along a longitudinal direction of the torque member. A first solar module retention member can be fixed to the torque member at a first location. The first solar module retention member can include a first projection extending approximately parallel to the first pivot axis and into the first aperture. A second solar module retention member can be fixed to the torque member at a second location spaced from the first location by a distance approximately equal to a distance between the first and second side portions of the frame. The second solar module retention member can include a tool-less fastener engaged with the second side portion. The first projection and the first aperture can be sized so as to allow the first solar module to be pivoted about the first aperture through a range of pivotal motion of at least about ten degrees between a first tilted position in which the first projection is engaged with the first aperture and the second side portion is completely disengaged from the tool-less fastener in a second position in which the first projection is engaged with the first aperture and the second side portion is engaged with the tool-less fastener.

In some embodiments a solar energy collection system can comprise a first solar module comprising a solar collection member including an upper surface configured to receive sunlight for conversion into electrical energy and a lower surface opposite the upper surface. The first solar module can also comprise a support frame supporting the solar collection module, the first solar module having a length extending along a longitudinal axis of the solar collection member. The frame can comprise a first side portion connected to the lower surface of the solar collection member on a first side of the longitudinal axis. A second side portion of the frame can be connected to the lower surface of the solar collection member and extending along a second side of the longitudinal axis opposite the first side. A torque member can be supported above the ground surface so as to pivot about a first pivot axis which extends generally along a longitudinal direction of the torque member. A first solar module retention member can be fixed to the torque member at a first location. The first solar module retention member can include first and second flat portions disposed on opposite sides of the pivot axis. A second solar module retention member can be fixed to the torque member at a second location spaced from the first location by a distance approximately equal to a distance between the first and second side portions. The second solar module retention member comprising third and fourth can comprise third and fourth flat portions disposed on opposite sides of the pivot axis.

At least a first connector portion disposed adjacent to the first flat portion can be included, wherein the first, second, third, and fourth flat portions are arranged so as to stably support the first solar module with the first side portion resting on the first and second flat portions and the second side portion resting on the third and fourth flat portions. The first, second, third, and fourth flat portions being sized to stably support the first and second side portions with the first solar module in a first position in which this first side portion is completely disengaged from the first connector portion and to stably support the first and second side portions as the first solar module is pushed in a direction so as to cause the first and second side portions to slide across the first, second, third, and fourth flat portions into a second position in which the first side portion is engaged with the first connector portion.

In some embodiments, a solar energy collection system can comprise at least a first solar module comprising a solar collection member including an upper surface configured to receive sunlight for conversion into electrical energy and a lower surface opposite the upper surface. The first solar module can also comprise a support frame supporting the solar collection module. A torque member can be supported above a ground surface so as to pivot about a first pivot axis which extends generally along a longitudinal direction of the torque member. A first solar retention member can be fixed to the torque member at a first location and contacting the support frame so as to support the first solar module. The first solar module retention member comprising a channel member having a substantially uniform channel cross section along a substantial portion of its length and extending along a generally W-shape and comprising first and second outer arm portions connected to a central curved portion, the central curved portion being fixed to the torque member.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 14 is a side elevational schematic view of two of the solar module retention members of FIG. 12 supporting two frame members of a solar module in a first position;

FIG. 15 is a side elevational schematic view of the arrangement of FIG. 14 with the solar module slid toward the right so as engage the frame members of the solar module with the solar module retention member;

DETAILED DESCRIPTION

Figure 1:
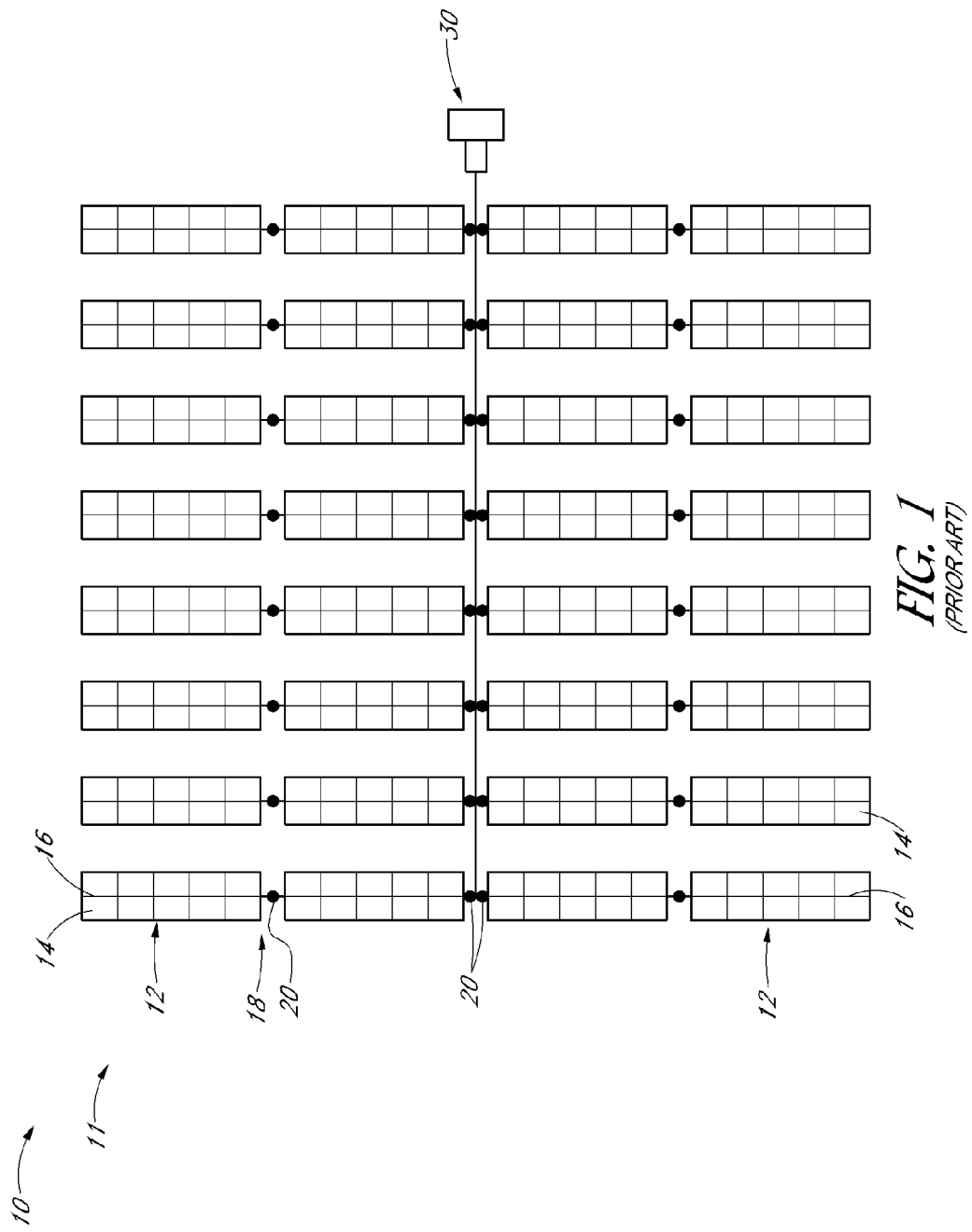
FIG. 1 is a schematic diagram of a prior art sun tracking photovoltaic system, with which the present embodiments can be used.

The following detailed description is merely illustrative in nature and is not intended to limit the embodiments or the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the proceeding technical field, background, brief summary, or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Tool-less connection"—The following description refers to devices or features being connected with "tool-less connections". As used herein, unless expressly stated otherwise, "tool-less connection" means that one element/node/feature is directly or indirectly joined to (or directly or indirectly communicates with) another element/node/feature with a mechanism that can be operated by a human without any tools or other separate parts to achieve a joined state and optionally to be disconnected from the joined state.

"Locating connector"—The following description refers to devices or features being connected with a "locating connector". As used herein, unless expressly stated otherwise, "locating connector" means that one element/node/ feature is directly or indirectly joined to (or directly or indirectly communicates with) another element/node/feature with a mechanism that connects and also provides a locating function, such as for example but without limitation, alignment of elements/nodes/features or enhancing contact between two elements/nodes/features.

The embodiments disclosed herein are described in the context of sun-tracking photovoltaic arrays and modules. However, these embodiments can be used in other contexts as well, such as non-sun-tracking solar systems, as well as concentrated photovoltaic solar systems and concentrated thermal solar systems, etc.

Figure 2:
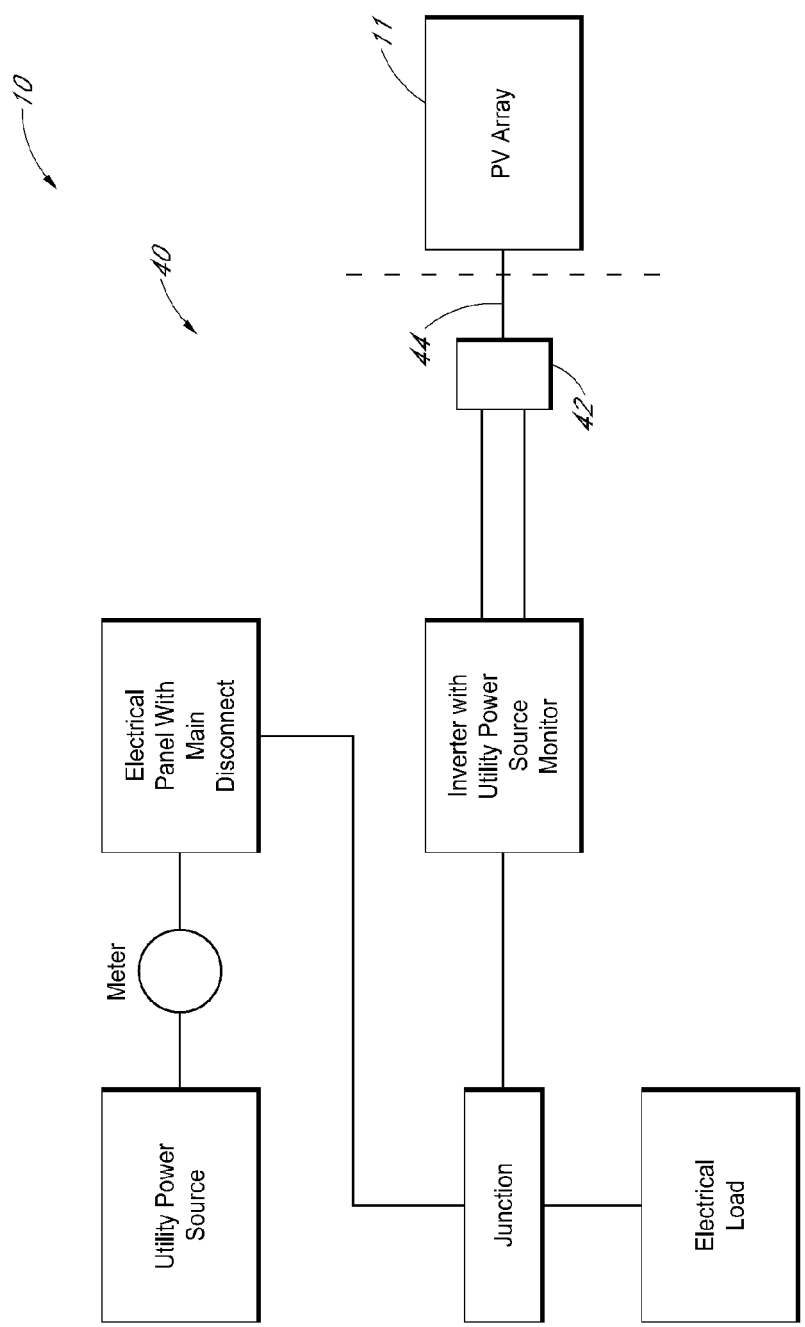
FIG. 2 is a schematic diagram of an electrical system for the photovoltaic system of FIG. 1.
Figure 3:
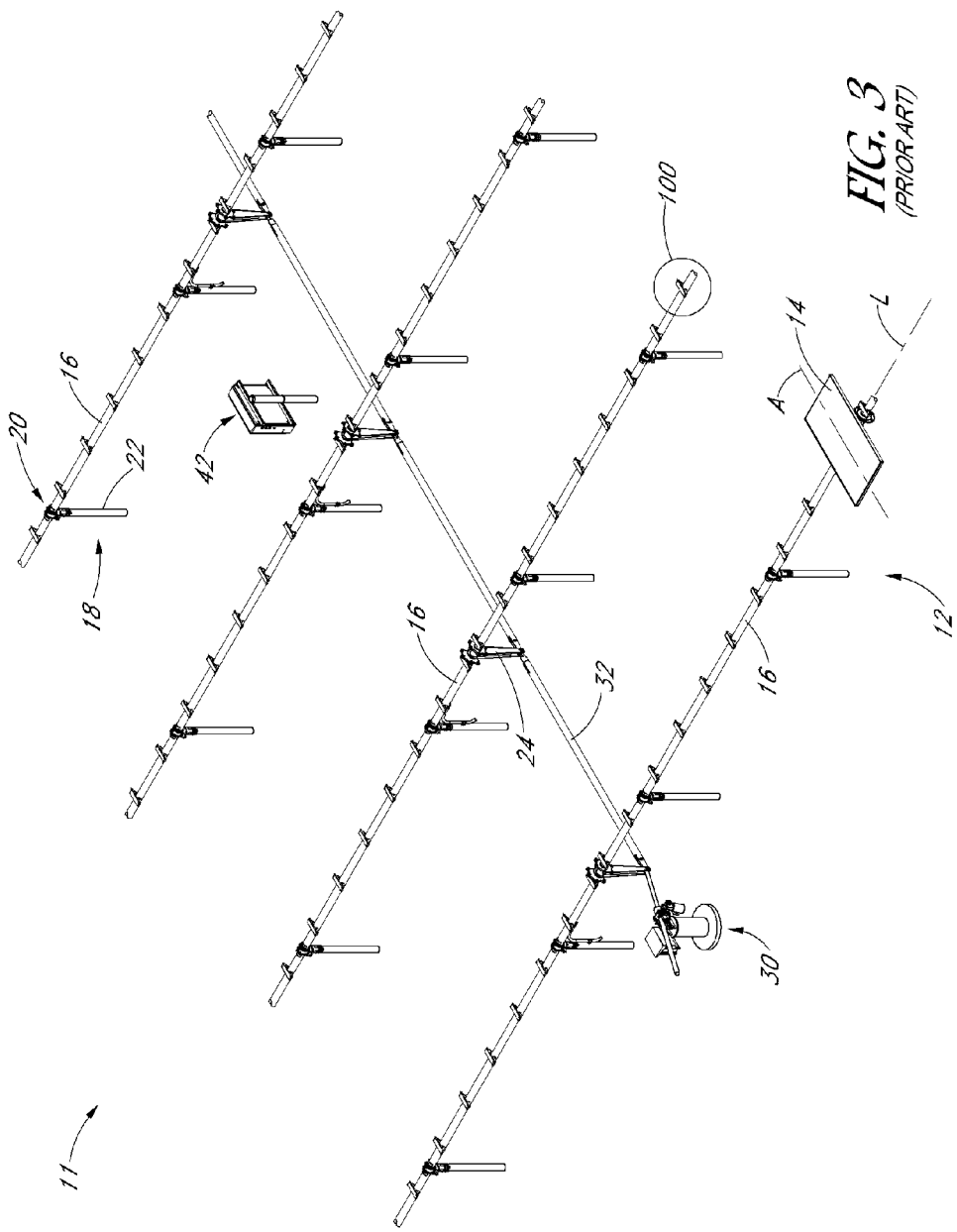
FIG. 3 is a perspective view of the solar collection system of FIG. 1, illustrating a plurality of piles mounted to the ground and supporting a plurality of torque tubes with a sun-tracking drive in accordance with an embodiment.

In the description of FIGS. 1-3 set forth below, an example of a prior art solar energy collection system 10 is described in the context of being formed by a plurality of solar collector devices, supported by torque tubes so as to be pivotally adjustable for sun-tracking purposes. Embodiments described below with reference to FIGS. 4-17, can be used with the solar collection system 10 illustrated in FIGS. 1-3, as well as the variations and equivalents thereof, including but without limitation, concentrated thermal solar systems.

FIG. 1 illustrates a prior art solar collection system 10, which can be considered an electricity farm. The solar collection system 10 includes a solar collector array 11 which includes a plurality of solar collection modules 12. Each of the solar collection modules 12 can include one or a plurality of solar collecting devices 14 supported by a drive shaft or torque tube 16. Each of the torque tubes 16 are supported above the ground by a support assembly 18, and can be bolted to, or mechanically linked to each other, by a torque transmission member or "coupling flange" located on at least one end of the torque tube 16.

With continued reference to FIG. 1, the system 10 can also include a tracking drive 30 connected to the torque tube 16 and configured to pivot the torque tube 16 so as to cause the collector devices 14 to track the movement of the sun. In the illustrated embodiment, the torque tubes 16 are arranged generally horizontally and the modules 12 can be connected to each other and the torque tubes 16, as more fully described in U.S. patent application Ser. No. 13/176,276, filed Jul. 5, 2011, the entire contents of which is hereby expressly incorporated by reference. However, embodiments disclosed herein can be used in the context of other types of arrangements. For example, the system 10 can include a plurality of modules 12 that are arranged such that the torque tubes 16 are inclined relative to horizontal, wherein the torque tubes 16 are not connected in an end to end fashion, such as the arrangement illustrated and disclosed in U.S. Patent Publication No. 2008/0245360. The entire contents of the 2008/0245360 patent publication, as well as the entire contents of the U.S. patent application Ser. No. 13/631782 are hereby expressly incorporated by reference. Further, the embodiments disclosed herein can be used in conjunction with the systems that provide for controlled tilting about two axes, although not illustrated herein.

The solar collection devices 14 can be in the form of photovoltaic modules, thermal solar collection devices, concentrated photovoltaic devices, or concentrated thermal solar collection devices. In the illustrated embodiment, the solar collection devices 14 are in the form of non-concentrated, photovoltaic (PV) modules. The photovoltaic modules 14 can include one or more photovoltaic cells, encased in a frame assembly including an optically transparent upper cover and a peripheral frame. The design and structure of such photovoltaic modules are well known in the art are thus are not described in further detail.

With reference to FIG. 2, solar collection system 10 can further include an electrical system 40 connected to the array 11. For example, the electrical system 40 can include the array 11 as a power source connected to a remote connection device 42 with power lines 44. The electrical system 40 can also include a utility power source, a meter, an electrical panel with a main disconnect, a junction, electrical loads, and/or an inverter with the utility power source monitor. The electrical system 40 can be configured and can operate in accordance with the descriptions set forth in U.S. Patent Publication No. 2010/0071744, the entire contents of which is hereby expressly incorporated by reference. Other electrical systems can also be used.

FIG. 3 illustrates the array 11 with all but one of the solar collection devices 14 removed. As shown in FIG. 3, each of the support assemblies 18 includes the bearing 20 supported at the upper end of a pile 22. The torque tube 16 can be of any length and can be formed in one or more pieces. The spacing of the piles 22, relative to one another, can be determined based on the desired limits on deflection of the torque tubes 16 between the support structures 18, wind loads, and other factors.

The tilt drive 30 can include a drive strut 32 coupled with the torque tube 16 in a way that pivots the torque tube 16 as the drive strut 32 is moved axially along its length. The drive strut 32 can be connected with the torque tube 16 with torque arm assemblies 34. In the illustrated embodiment, the torque arm assemblies 34 disposed at an end of each of the torque tube 16.

Also illustrated in FIG. 3 is a solar module retention member arrangement 100 including one or more solar module retention members fixed to a torque tube 16, which are generally referred to as "saddle members" in the art. Detailed descriptions of the various embodiments of the solar module retention arrangements 100, 100A, 100B are described below with reference to FIGS. 4-16.

The torque tube 16 can have a solid or cylindrical body, extending along a longitudinal axis L. The cylindrical body can have any cross-sectional shape, including but without limitation, round, square, triangular, rectangular, polygonal, or other shapes. Thus, as used herein, the term "cylindrical" is intended to mean "a surface or solid bounded by two parallel or skewed planes and generated by a straight line moving parallel to the given planes and tracing a closed shape with any number of curved and/or straight segments, bounded by the planes and lying in a plane perpendicular or oblique to the given planes."

An aspect of at least one of the embodiments disclosed herein includes the realization that certain components of solar power systems, such as those components used to attach solar collection devices to pivoting structural members such as torque tubes, can be made at lower costs than known designs. For example, solar module retention members, also known as "saddle mounts" typically include a curved central portion and flat distal ends on either side of the curved central portion. The curved central portion is shaped so as to correspond to an outer surface of a torque tube for facilitating secure connection thereto. The flat portions at the opposite ends of the saddle are used for supporting the solar collection devices.

The relatively complex shape of saddle mounts resulted in some prior designs which include side walls having a generally straight upper edge and a lower edge that extends through a wave-like configuration, thus resulting in a member having a non-uniform cross-section along its length.

Figure 4:
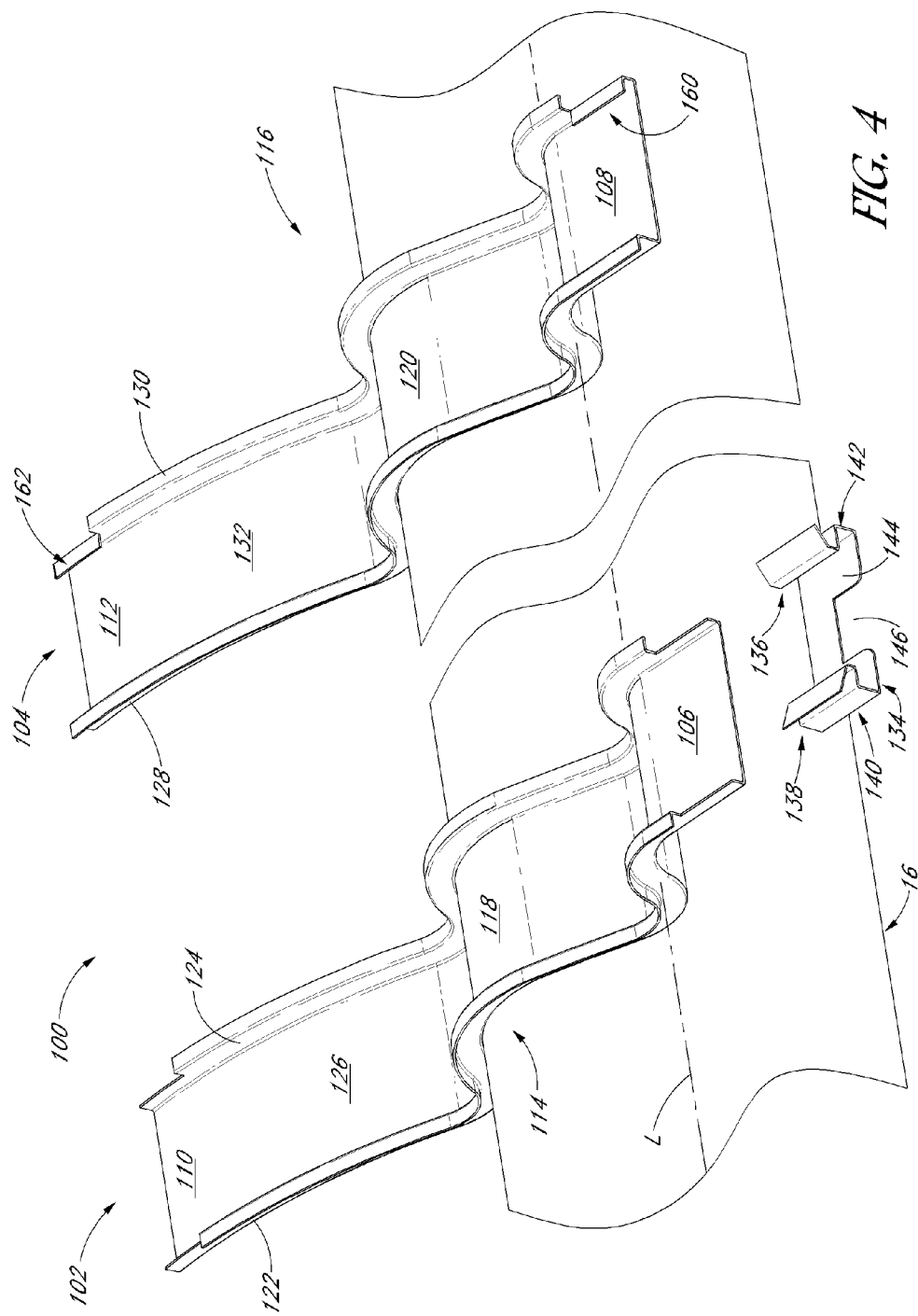
FIG. 4 is a perspective view of an embodiment of a solar module retention member arrangement.

With reference to FIG. 4, an improved solar member retention assembly 100 can include one or more saddle members 102, 104. At least one of the saddle members 102, 104 can have a generally uniform cross section along their length which extends in a direction generally transverse to the axis L of the torque tube 16, and includes flat portions at opposite distal ends and a curved central portion.

For example, the saddle members 102, 104 can include first distal ends 106, 108 respectively and second distal ends 110, 112, respectively. The first and second ends 106, 110 of the saddle member 102 can be generally coplanar with each other. Additionally, optionally, the first and second ends 108, 112 of the saddle member 104 can also be coplanar with each other and coplanar with the first and second ends 106, 110 of the saddle member 102. Other configurations can also be used.

The saddle members 102, 104 also include a curved central portion 114, 116. The curved central portions 114, 116 include a convexly curved central shape that is complimentary to an outer surface of the torque tube 16. As such, the saddle mounts 102, 104 generate a curved contact area 118, 120 which facilitates connection to the torque tube 16, for example, but without limitation, by welding.

As noted above, the saddle members 102, 104 can include a generally uniform cross sectional shape along their length, between their first ends 106, 108 and their second ends 110, 112. For example, a cross section of the saddle members 102, 104 at any position between the first ends 106, 108 and the second ends 110, 112 is generally channel-shaped. As such, each of the saddle mounts 102, 104 have a generally W-shaped configuration and a generally uniform cross section between the first ends 106, 108 and the second ends 110, 112. Such a shape can be conveniently manufactured by a stamping process. For example each of the saddle mounts 102, 104 can be formed initially with a flat piece of sheet metal or a channel member, and then stamped into the illustrated shape.

Although described herein as having a generally uniform cross section, the saddle mounts 102, 104 also include additional connection features, described in greater below, at the first ends 106, 108 and the second ends 110, 112. Thus the cross section of the saddle mounts 102, 104 are not entirely uniform at the distal ends.

For example, the saddle mount 102 includes a first side wall 122 and a second side wall 124. The side walls 122, 124 are connected by a central web portion 126. The side walls 122, 124, and the central web portion 126 extend parallel to each other. Additionally, the distal portions of the central web portion 126 form the flat first and second end portions 106, 110. Similarly, the saddle mount 104 includes side walls 128, 130 and a central web portion 132.

In the illustrated embodiment, the combination of the saddle mounts 102, 104 define a solar collector retention assembly 100, which cooperate with each other to securely retain a solar collection device to the torque tube 16.

In the illustrated embodiment, the saddle mount 102 can include a connector member 134 configured to engage and thereby retain a solar module to the saddle mount 102. For example, in some embodiments, the connector 134 can be configured to provide a snap fit with a solar module. For example, the connector member 134 can include at least one deflectable projection 136 configured to be biased so as to snap fit with a feature on a solar module, described in greater detail below. Optionally, the connector member 134 can include a second deflectable projection 138 also biased so as to provide a snap fit engagement with a feature on a solar module.

The connector member 134, optionally, can include first and second side walls 140, 142 and a central web portion 144 connecting the side walls 140, 142. The size of the web portion 144 and side walls 140, 142 can be configured to fit over at least a portion of the flat portion 106 of the first end of the saddle mount 102. For example, the side walls 140, 142 can be spaced such that the connector member 134 can fit around the portions of the side walls 122, 124 adjacent the first end 106 of the saddle mount 102. Optionally, the connector member 134 can include a tab 146 configured to fit over an upper side of the flat end 106 with the central web portion 144 extending below the flat portion 106. Optionally, a second connector member (not shown) the same or similar to the connector member 134 can be provided for the second end 110 of the saddle mount 102.

Figure 5:
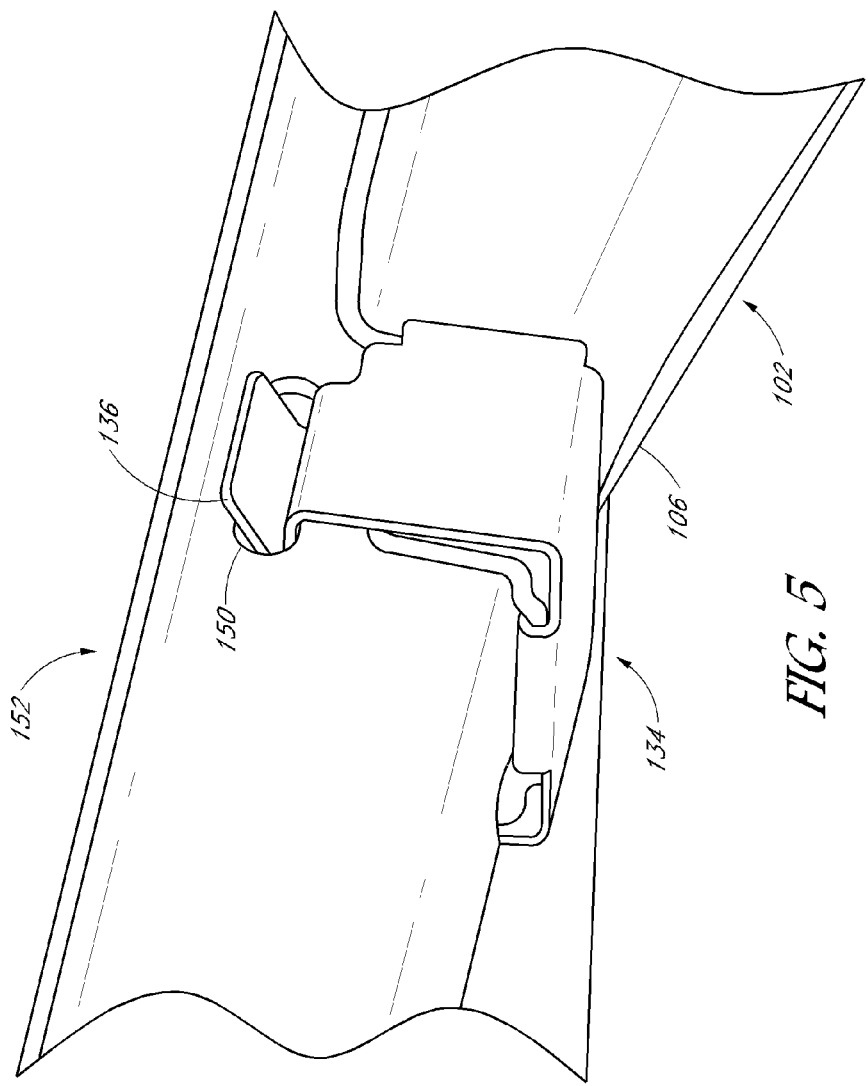
FIG. 5 is an enlarged perspective view of one end of another embodiment of the solar module retention member of FIG. 4.

FIG. 5 illustrates the connector member 134 engaged with the first end 106 of the saddle mount 102. Additionally, FIG. 5 illustrates the deflectable projection 136 extending into an aperture 150 of a frame member 152 of a solar module. The frame member 152 can be mounted only to a bottom surface of a solar energy collection device, such as a "laminate." Alternatively, the frame member 152 could be the type of frame member that extends along a portion of a periphery of a laminate of a solar module.

Optionally, the connector member 134 can be made integrally or monolithically with the saddle member 102. In some embodiments, the connector member 134 can be made from spring steel, which further facilitates the deflectable nature of the deflectable portions 136, 138, for example, deflecting outwardly as a portion of a solar module passes between he projections 136, 138 and the return of the deflectable projections 136, 138 toward their biased position so as to retain a solar module in a desired location, described in greater detail below.

With continued reference to FIG. 4, the saddle member 104 can include one or more projections. For example, the saddle member 104 can include a projection 160 disposed at the first end 108 of the saddle member 104. The projection 160 can be configured to engage a feature on a frame of a solar module. Further, the projection 160 can be a "locating connector", for example, it can be configured to provide for a positive locating function of a solar module while allowing a solar module to be pivoted relative to the saddle mount 104 and/or the saddle mount 102. In some embodiments, the projection 160 is made from a bent piece of the saddle mount 104. For example, where the saddle mount 104 is made from stamped sheet material, a portion of the sheet material can be bent transversely relative to the side wall 130 so as to extend inwardly toward the central web portion. Optionally, the saddle mount 104 can include a second projection 162 disposed at the second end 112 of the saddle mount 104. Similarly, the projection 162 can be configured to extend into a feature, such as an aperture, on a frame of a solar module. Further, the projection 162 can be configured to allow the solar module to be tilted relative to the saddle mounts 104 and/or 102 while remaining engaged and thereby positively located by the projection 162.

Figure 6:
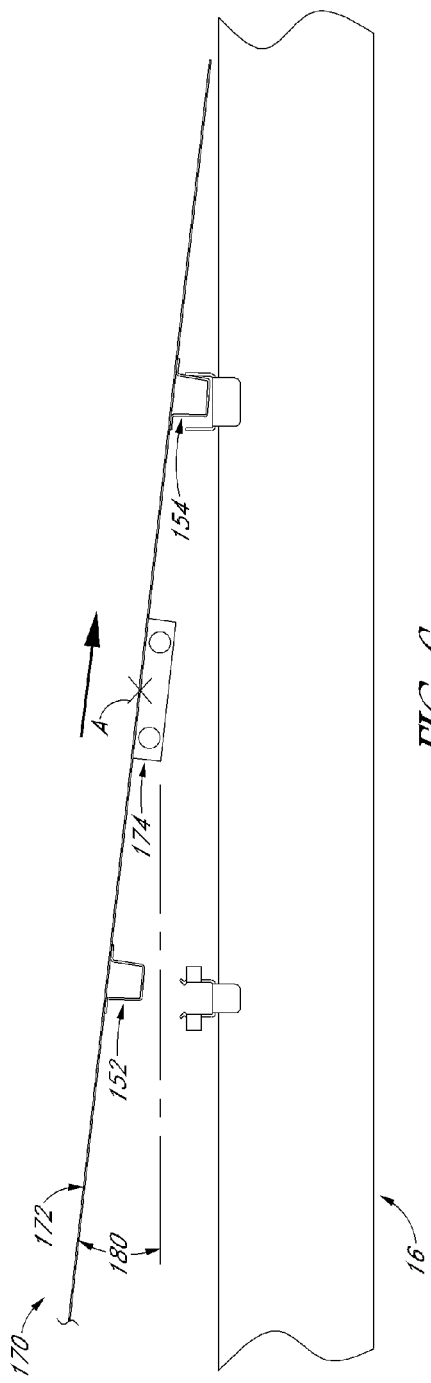
FIG. 6 is a side elevational schematic view of a step of a method that can be used for mounting a solar module to the retention members of FIGS. 4 and 5.
Figure 7:
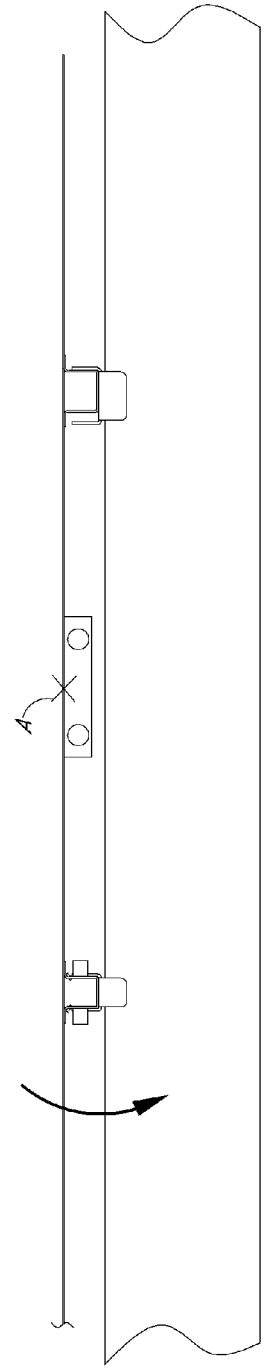
FIG. 7 is a side elevational view of another step of a method that can be used to attach a solar module to the solar module retention members of FIGS. 4 and 5.

With reference to FIGS. 6 and 7, the saddle mounts 102, 104 can be configured to engage and retain a solar module 170. The solar module 170 can have any typical configuration. For example, the solar module 170 can include a laminate 172 which can include one or more "solar cells," having any configuration, and encapsulated within an "encapsulant." The solar cells within the laminate 172 face upwardly (as oriented in FIGS. 6 and 7) so as to be exposed to sunlight for a conversion of sunlight into electrical energy. In some embodiments, the solar module 170 can include one or more electrical components 174 such as a junction box, inverter, or other devices. In the illustrated embodiments, the laminate extends in a longitudinal direction A (FIGS. 3, 6, and 7). Other configurations can also be used. Such designs are well known in the art and are not described in greater detail below.

Additionally, the solar module can have one or more frame members, such as frame member 152 noted above and frame member 154 (FIG. 6). In the configuration illustrated in FIGS. 6 and 7, the two frame members 152, 154 are bonded directly to a lower side of the laminate 172.

In other embodiments (not shown), the module 170 can include a plurality of frame members extending along an outer periphery of the laminate 172. Those of ordinary skill in the art can understand how to apply the teachings and disclosures set forth herein to modules having peripheral frames.

In some embodiments, the frame members 152, 154 can extend generally parallel to the longitudinal axis A of the laminate 172. Additionally, the frame members 152, 154 can be positioned generally symmetrically relative to the longitudinal axis A, thereby providing the module 170 with a balanced arrangement of the frame members 152, 154.

In some embodiments, the frame members 152, 154 can each include one or more apertures, such as the aperture 150 described above with reference to FIG. 5. For example, the frame members 152 can include four apertures 150 disposed on opposite lateral sides of each frame member 152 so as to be generally aligned with the deflectable projections 136, 138 disposed at each of the longitudinal ends 106, 110 of the saddle member 102.

Similarly, the frame member 154 can include one or more apertures, such as the aperture 150 on the frame member 152, in a position so as to be aligned with the projections 160, 162 on the saddle member 104 (FIG. 4). Optionally, the frame members 152, 154 can each have four of the same sized apertures in the same locations. Such a configuration of the frame members 152, 154 provide additional cost savings in that the frame members 152, 154 can be identical to each other, and thus remove the need for creating two different frame members for each module 170. However, other configurations can also be used.

In some embodiments, the apertures 150 on the frame member 154 and the projections 160, 162 can be configured so as to capture the frame member 154 so as to register the position of the module relative to the torque tube 16 in a direction generally parallel to the axis A of the solar module 170, with the flat surfaces at the ends 108, 112 of the saddle member 104, providing support to the frame member 154 in the vertical direction and the side wall 130 of the saddle member 104 preventing further movement of the module 170, relative to the torque tube 16, towards the right-hand side of FIG. 6.

Additionally, the aperture 150 on the frame members 154 and the projections 160, 162 can be sized and configured to allow the module 170 to be tilted through a range of motion, represented by angle 180 of FIG. 6, between a horizontal orientation (illustrated in phantom and corresponding to the position illustrated in FIG. 7) and a tilted-up position with the apertures in the frame member 154 remaining engaged with the projections 160, 162. The projections 160, 162 and the apertures 150 in the frame member 154 can be sized so as to remain engaged when pivoted through an angle 180 between about 5 and 20 degrees.

As such, when an assembler is attaching the module 170 to the torque tube 16, the assembler can first engage the frame member 154 with the saddle member 104 by aligning the apertures 150 of the frame member 154 with the projections 160, 162, with the module 170 tilted in an up-tilted position, then tilt the module 170 downwardly so as to engage the frame member 152 with the saddle member 102.

This configuration can significantly simplify installation processes and reduce the number of people required for engaging a solar module 170 with a torque tube 16.

Optionally, as noted above, the solar module retention assembly 100 can include a tool-less connection. Thus, with continued reference to FIGS. 5, 6 and 7, as the frame member 152 is moved into engagement with the saddle member 102, the deflectable projections 136, 138 can be first deflected outwardly as a lower surface of the frame member 152 contacts the sloped upper faces of the deflectable projections 136, 138, then snap inwardly such that the deflectable projections 136, 138 snap into the apertures 150 on the frame member 152.

The connector 134, including the portions of the connector 134 forming the deflectable projections 136, 138, can be made from any material. Further benefits can be achieved by forming the connector 134 from spring steel. As such, the thickness and shape of the connector member 134, and in particular the portions forming the deflectable projections 136, 138, can be designed to provide the desired retaining performance for retaining the frame member 152 within the saddle mount 102.

For example, engaged in the position illustrated in FIG. 7, it is desirable that the projections 160, 162 on the saddle member 104 and the deflectable projections 136, 138 of the saddle member 102 can cooperate to retain the solar module 170 in the engaged position illustrated in FIG. 7 as the torque tube 16 is rotated through its sun-tracking range of motion, which can be as much as about 45 degrees from horizontal. Further, optionally, the connector members 134 and projections 160, 162 can be configured to retain the solar module 170 in the engaged position illustrated in FIG. 7 with the torque tube 16 completely inverted, such that the entire weight of the module 170 is supported by the projections 160, 162 and the connector members 134, and more specifically, the deflectable projections 136, 138. Further, the projections 160, 162 and the connector members 134 can be configured to retain the solar module in the engaged position illustrated in FIG. 7 under any design load parameters, such as maximum wind forces that may act upon the modules 170. Thus, in some designs, the projections 160, 162 and the connector members 134 can be configured to withstand upward forces of about at least 200 pounds. In some sites, higher wind loads might present a need for the connections to be configured to loads of up to 1500 lbs. Those of ordinary skill in the art know how to size the materials of the various components described above to withstand such loads. Additionally, any of the embodiments disclosed herein can also include other types of fasteners to supplement the holding effect of the tool-less connections, for example, but without limitation, threaded fasteners, rivets, welds, etc.

With reference to FIGS. 8-11, a further embodiment of the solar module retention assembly 100 is illustrated therein and identified generally by the reference numeral 100A. Components of the solar module retention member 100A that are the same or similar to the solar modular retention assembly 100 are identified with the same reference numerals, except that a letter "A" has been added thereto.

The solar module retention assembly 100A can include one or a plurality of saddle members 102A, which are similar to the saddle member 102 illustrated in FIG. 4. Primarily, the difference between the saddle member 102 illustrated in FIG. 4 and the saddle member 102A illustrated in FIG. 8 is features disposed at the distal ends 106, 110.

Figure 8:
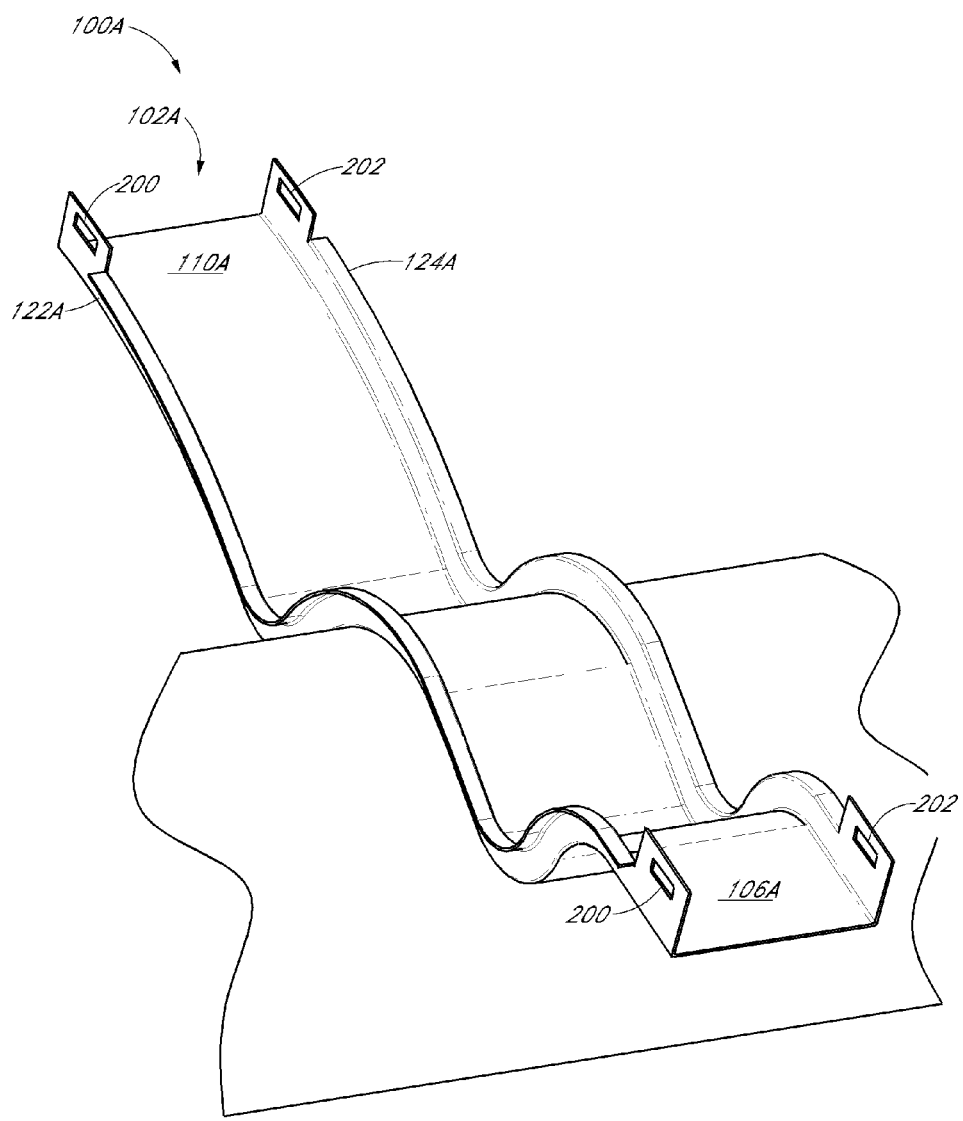
FIG. 8 is a perspective view of another embodiment of a solar member retention member.
Figure 9:
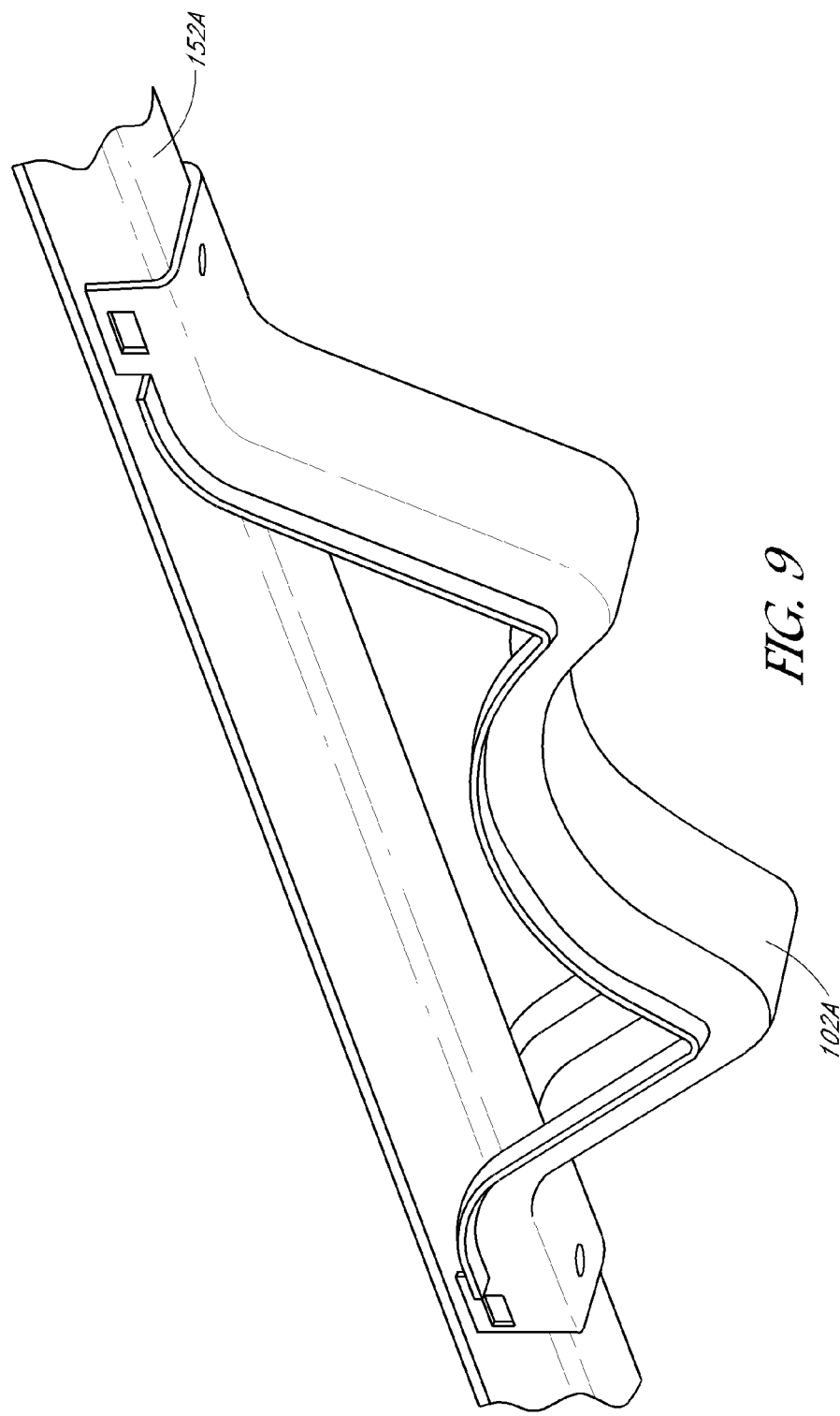
FIG. 9 is another perspective view of the solar module retention member of FIG. 8 engaged with a frame member of a solar module.
Figure 10:
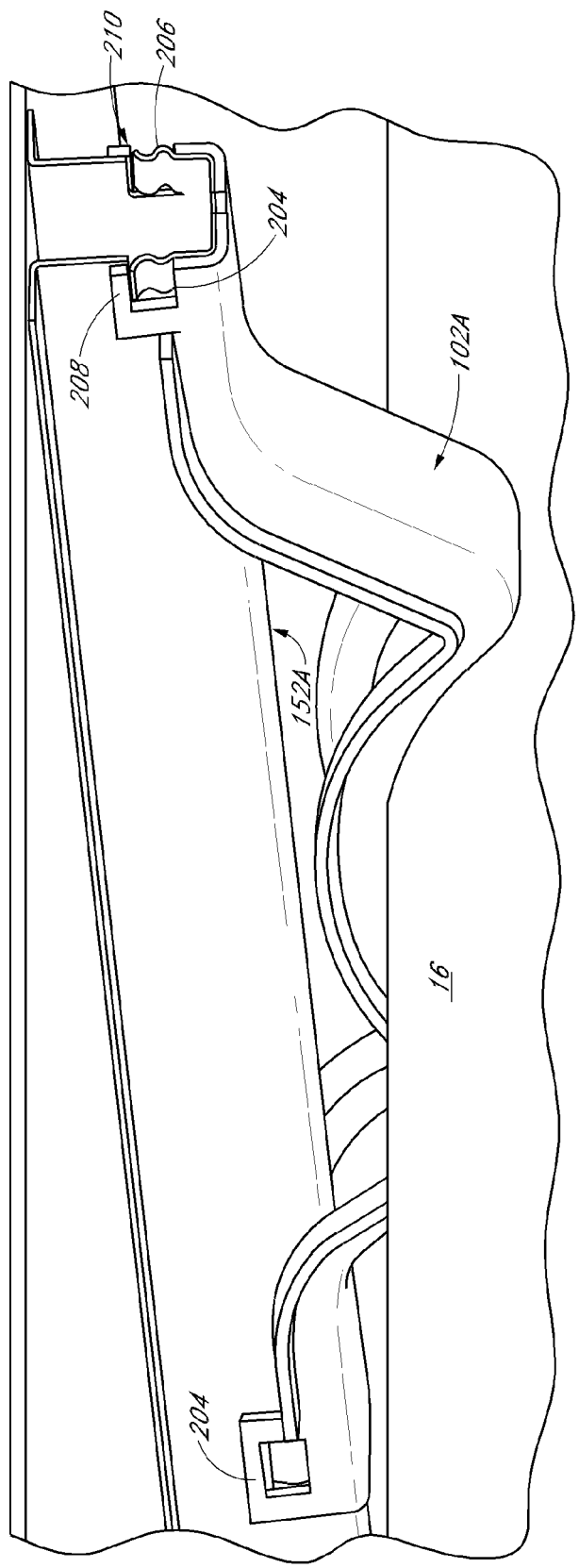
FIG. 10 is a perspective and partial sectional view of the solar module retention member of FIG. 9.
Figure 11:
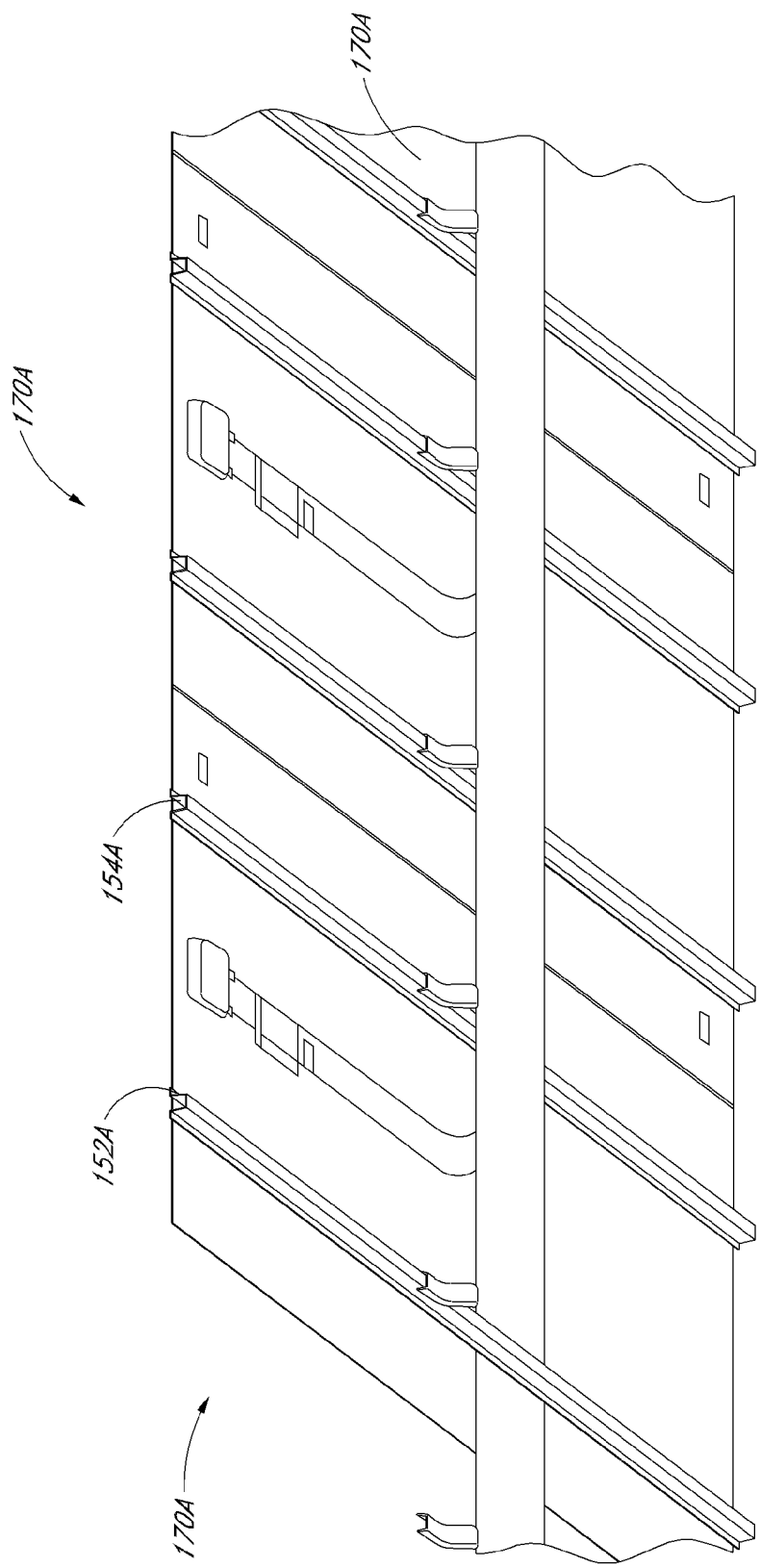
FIG. 11 is perspective view of a plurality of solar modules attached with a plurality of the solar module retention members of FIG. 9.
Figure 12:
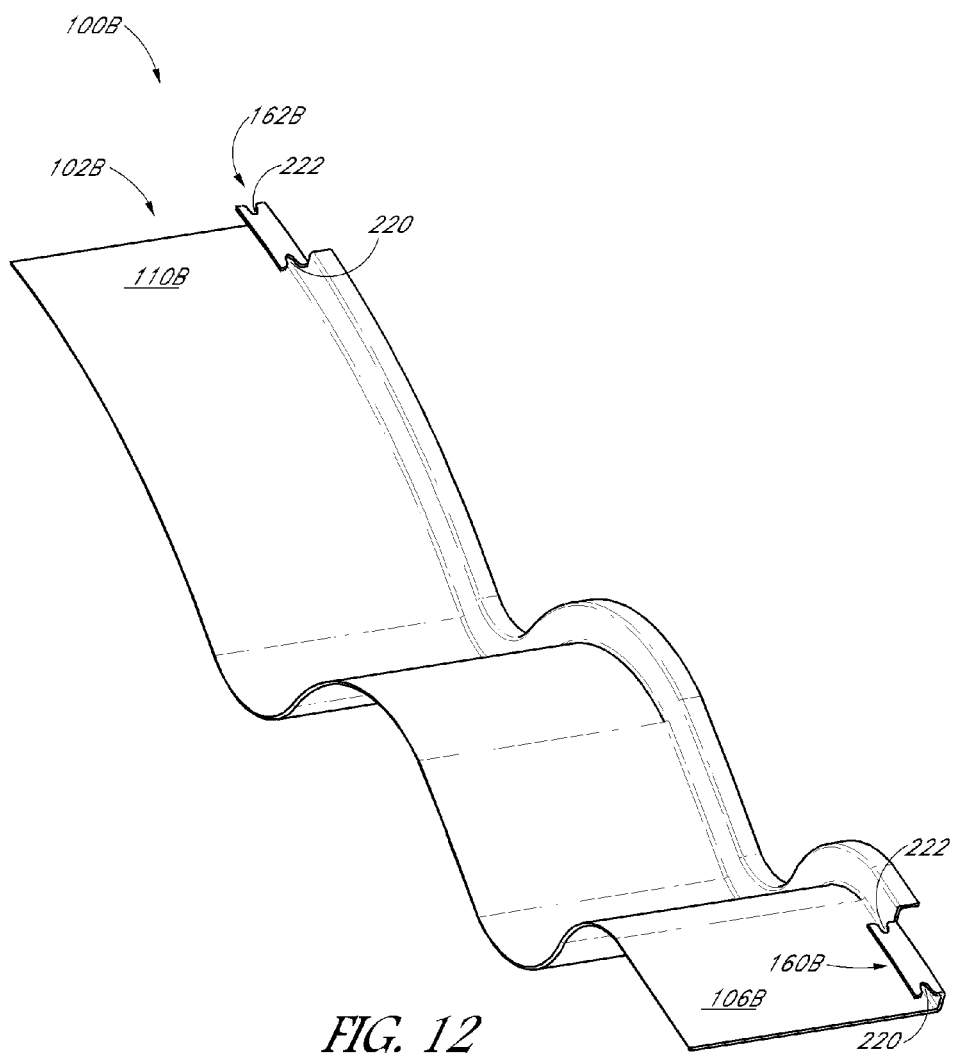
FIG. 12 is a perspective view of another embodiment of a solar module retention member.

As shown in FIG. 8, the side walls 122, 124 include apertures 200 and 202, respectively. With reference to FIGS. 9-11, each of the solar modules 170A can include frame members 152A, 154A, each of which can include deflectable projections 204, 206. The deflectable projections 204, 206 can be configured to be deflectable between recessed and extended positions and to form a snap or interference fit with the apertures 200, 202, respectively.

In the illustrated embodiment, with reference to FIG. 10, the deflectable projections 204, 206 can be formed integrally with side walls of the frame members 152, 154. In the illustrated embodiment, the deflectable projections 204, 206 are formed as tabs in the side walls of the frame members 152A, 154A, with upper ends 208, 210 configured to form an interference fit with the apertures 200, 202, and in particular, the upper edges of the apertures 200, 202, as illustrated in FIG. 10.

Thus, as a solar module 170A is lowered onto a plurality of saddle members 102A, the frame members 152A, 154A can be lowered into the space between the side walls 122A, 124A. Additionally, as the frame members 152A, 154A are slid downwardly between the side walls and the deflectable projections 204, 206 are aligned with the apertures 200, 202, the deflectable projections will initially slide inwardly and then snap outwardly, due to their bias, and interfere with the upper edges of the apertures 200, 202. As described above with reference to the embodiments of FIGS. 4-7, the apertures 200, 202 and the deflectable projections 204, 206 can be configured to provide the desired holding strength or resistance to wind or other gravitational forces.

With reference to FIGS. 12-16, a further embodiment of the solar module retention assembly 100 is illustrated therein and identified generally by the reference numeral 100B. The solar module retention assembly 100B can include a saddle member 102B which is most similar to the saddle member 102. For example, the saddle member 102B includes projections 160B, 162B. Optionally, the saddle member 102B can omit the side wall 122 included in the saddle member 102. Optionally, each of the projections 160B can include recesses 220, 222.

With reference to FIGS. 13-16, the projections 160B, 162B can be configured to form an interference fit with features on the frame members 152B, 154B.

Figure 16:
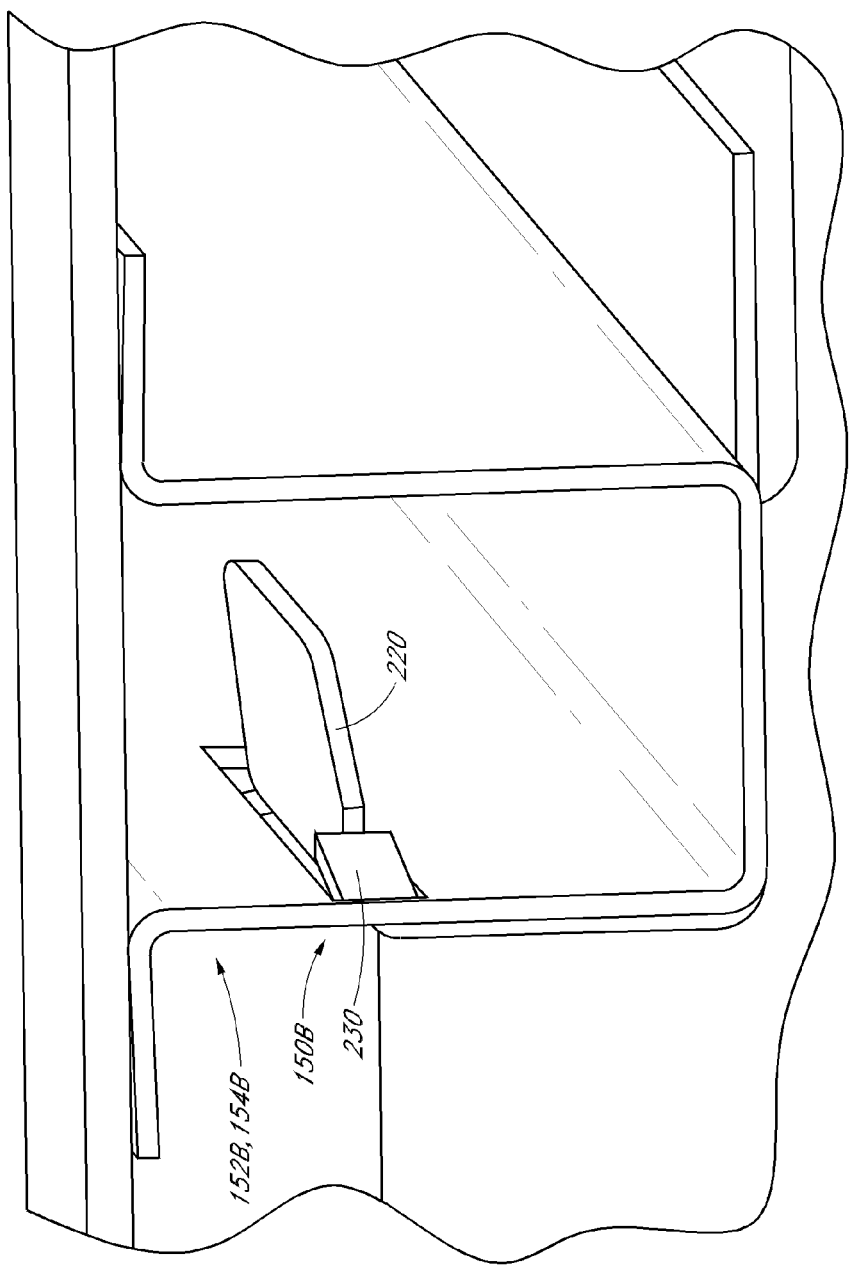
FIG. 16 is a an enlarged perspective view of one end of the solar module retention member of FIG. 12 and a partial sectional view of the frame member engaged therewith.

For example, with reference to FIG. 16, the frame members 152B, 154B can include apertures 150B with an interference tab 230. For example, the interference tab 230 can be formed from a tab-shaped portion of the material forming a side wall of the frame members 152B, 154B, and extending, at its free end, into the aperture 150B. Thus, as the projection, such as the projections 160B or 162B, are inserted into the aperture 150B, the interference tab 230 can engage one or more of the recesses 220, 222 so as to prevent the frame member 152B, 154B from disengaging from the projections 160B, 162B. Thus, the interference tab 230 can provide a snap or interference fit between the saddle member 102B and the frame members 152B, 154B.

Figure 13:
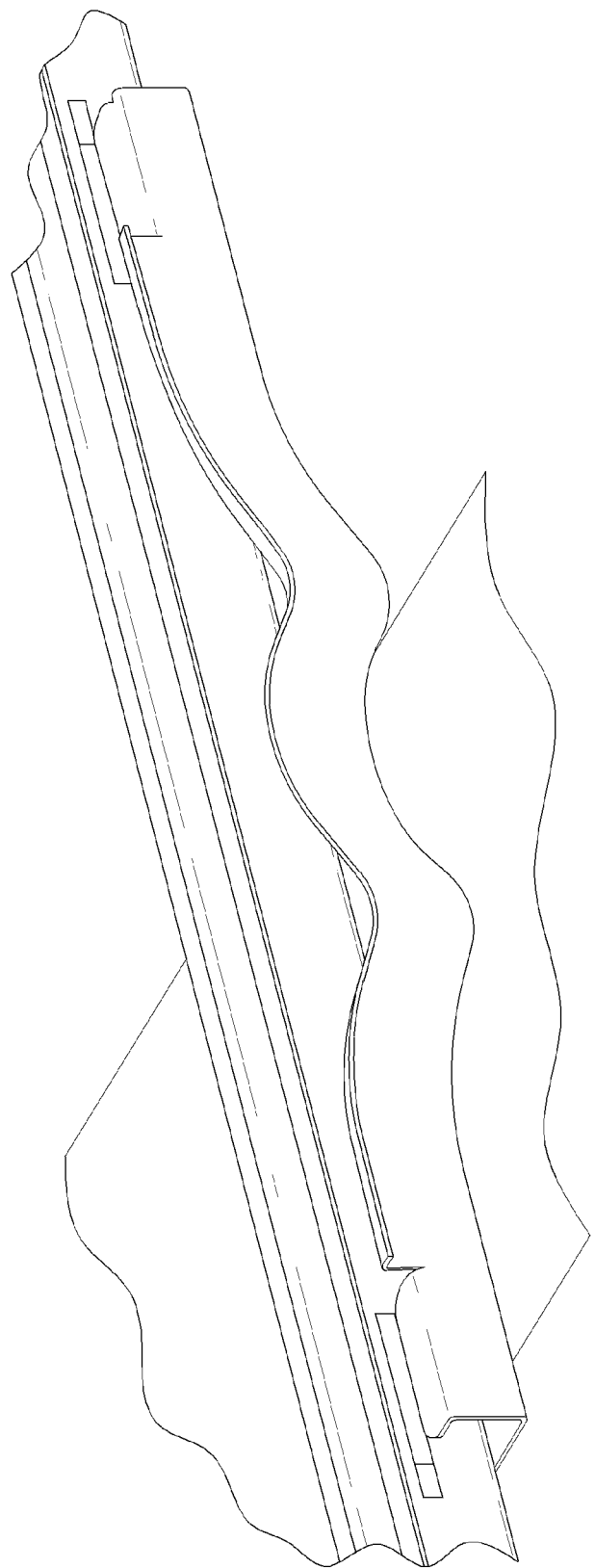
FIG. 13 is a perspective view of the solar module retention member of FIG. 12 supporting a frame member of a solar module.

FIGS. 13-15 illustrate an optional procedure for connecting the solar module 170B with the torque tube 16. For example, as shown in FIGS. 13 and 14, the solar module 170B can be placed onto and supported by the flat surfaces at the distal ends 106B, 110B, and with the frame members 152B, 154B spaced away from the projections 160B, 162B. Then, as shown in FIG. 15, the module 170B can be slid toward the right (as viewed in FIG. 15), until the projections 160B, 162B extend through the apertures 150B and until the interference tabs 230 engage with the recesses 220 or 222, thereby locking the frame members 152B, 154B to the saddle members 102B.

This configuration provides some optional additional benefits. For example, by sizing the saddle members 102, 102B with flat surfaces at the distal ends 106, 106B, 110, 110B that are sufficiently large to allow the solar module to be placed and rested upon the saddle members 102, 102B in a position in which the projections do not contact the frame members the solar module 170 can be placed in a location and fully supported by the saddle members 102, 102B. Assemblers can leave the solar module 170, 170B in this position and move around the solar module 170, 170B while aligning the apertures with the projections. Then, the entire module 170, 170B can be slid in a single direction into a locked engagement. This can help reduce the number of assemblers required to attach a single solar module 170, 170B to a torque tube 16, and thereby lower labor costs associated with constructing a solar energy collection system. Other configurations can also be used.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar energy collection system comprising:
at least first and second solar modules, each comprising:
a solar collection member including an upper surface configured to receive sunlight for conversion into electrical energy and a lower surface opposite the upper surface, and
a support frame connected to the lower surface of the solar collection member;
a plurality of solar module retention members supporting the first and second solar modules; and
at least one tool-less connection connected to at least one of the plurality of solar module retention member and configured to engage a corresponding support frame of one of the first and second solar modules.

2. The solar energy collection system according to claim 1, wherein the at least one tool-less connection comprises a snap fastener.

3. The solar energy collection system according to claim 1, wherein the at least one tool-less connection comprises first and second leaf spring members including first and second projecting portions extending into first and second apertures disposed on the support frame of the first solar module.

4. The solar energy collection system according to claim 3, wherein the first and second projecting portions comprise first and second slanted ramp faces, respectively, extending away from each other.

5. The solar energy collection system according to claim 3, wherein the at least one tool-less connection is configured to be releasable from the support frame of the first solar module without the need for any tools.

6. The solar energy collection system according to claim 1, wherein at least one of the tool-less connections comprises:
- at least a first projection disposed on the at least one solar module retention member and having an enlarged distal end;
- at least a first aperture disposed on the support frame of the first solar module; and
- a deflectable tab fixed to the support frame of the first solar module and extending across a portion of the first aperture so as to be deflected by the first projection as the enlarged distal end is moved into the first aperture, then spring back to a fully extended position so as to prevent the enlarged distal end from being removed from the aperture.

7. The solar energy collection system according to claim 1, wherein the support frame of the first solar module comprises at least a first side portion disposed on a first side of a longitudinal axis of the solar collection member and a second side portion disposed on a second side of the longitudinal axis of the solar collection member opposite the first side, wherein at least first and second of the plurality of solar module retention members are fixed to a support body at positions spaced from each other by a distance approximately equal to a distance between the first and second side portions.

8. The solar energy collection system according to claim 1, wherein the at least one tool-less connection is configured to withstand to withstand upward forces of about at least 200 pounds.

9. The solar energy collection system according to claim 1, wherein the at least one tool-less connection is configured to withstand to withstand upward forces of about at least 1500 pounds.

10. A solar energy mounting arrangement comprising:
- a solar collector assembly including a support frame comprising a first side portion and a second side portion;
- a support arrangement comprising first and second support surfaces arranged so as to stably support the solar collector assembly;
- a first solar module retention member fixed to the support arrangement at the first support surface, the first solar module retention member comprising a first tool-less connector configured to engage with a first engagement feature of the first side portion of the support frame;
- a second solar module retention member fixed to the support arrangement at the second support surface, the second support surface spaced apart from the first support surface by a distance approximately equal to a distance between the first and second side portions of the support frame, the second solar module retention member comprising a second tool-less connector configured to engage with a second engagement feature of the second side portion of the support frame; and
- wherein the first and second solar module retention members are sized so as to allow the solar collector assembly to be pivoted around the first engagement feature through a range of pivotal motion of at least 2 degrees between a first tilted position in which the first tool-less connector is engaged with the first engagement feature and the second tool-less connector is completely disengaged with the second engagement feature and a second position in which the first tool-less connector is engaged with the first engagement feature and the second tool-less connector is engaged with the second engagement feature.

11. The mounting arrangement according to claim 10, wherein each of the first and second engagement features comprises first and second apertures, and wherein the first and second tool-less connectors each comprise first and second leaf spring members including first and second projecting portions extending into the first and second apertures of a corresponding one of the first and second side portion of the support frame.

12. The mounting arrangement according to claim 10, wherein the first and second tool-less connectors each are configured to be releasable from the first and second side portions of the support frame without the need for any tools.

13. The mounting arrangement according to claim 10, wherein the first and second tool-less connectors are each configured to withstand to withstand upward forces of about at least 200 pounds.

14. The mounting arrangement according to claim 10, wherein the first and second tool-less connectors are each configured to withstand to withstand upward forces of about at least 1500 pounds.

15. A solar module retention apparatus comprising:
- a first solar module retention member fixed to a support body at a first location, the first solar module retention member including at least a first tool-less fastener configured to engage a first engagement feature of a first side portion of a support frame of a solar collection module;
- a second solar module retention member fixed to the support body at a second location spaced from the first location by a distance approximately equal to a distance between the first side portion and a second side portion of a support frame of a solar collector module, the second solar module retention member including at least a second tool-less fastener configured to engage with a second engagement feature of the second side portion of the support frame of the solar collection module;
- wherein the first and second engagement features are configured to allow a solar collection module to be pivoted around the first engagement feature through a range of pivotal motion of at least 2 degrees between a first tilted position in which the first tool-less fastener is engaged with the first engagement feature and the second tool-less fastener is completely disengaged with the second engagement feature and a second position in which the first tool-less connector is engaged with the first engagement feature and the second tool-less connector is engaged with the second engagement feature.

16. The solar module retention apparatus according to claim 15, wherein the first engagement feature comprises a flat portion and the second engagement feature comprises a second flat portion, the first and second flat portions arranged so as to stably support a solar collection module.

17. The solar module retention apparatus according to claim 15, wherein the second engagement feature comprises a first aperture in the second side portion of the support frame, and wherein the second tool-less fastener comprises at least a first leaf spring member including at least a first projecting portion extending into the first aperture of the second side portion of the support frame.

18. The solar module retention apparatus according to claim 17, wherein the first projecting portion comprises a first slanted ramp face.

19. The solar module retention apparatus according to claim 15, wherein the first and second tool-less fasteners are each configured to withstand to withstand upward forces of about at least 200 pounds.

20. The solar module retention apparatus according to claim 15, wherein the first and second tool-less fasteners are each configured to withstand to withstand upward forces of about at least 1500 pounds.

* * * * *